United States Patent
Ramey et al.

[11] Patent Number: 6,091,605
[45] Date of Patent: Jul. 18, 2000

[54] MEMORY CARD CONNECTOR AND COVER APPARATUS AND METHOD

[76] Inventors: Samuel C. Ramey, 1906 Lauderdale Rd., Louisville, Ky. 40502; Jeffrey S. Simpson, 1005 Estate Cir., Georgetown, Ind. 47122

[21] Appl. No.: 09/131,617

[22] Filed: Aug. 10, 1998

Related U.S. Application Data

[63] Continuation of application No. 08/638,612, Apr. 26, 1996, abandoned.

[51] Int. Cl.[7] .................................................... H05K 1/14
[52] U.S. Cl. .......................................................... 361/737
[58] Field of Search ................................. 439/76.1, 946; 361/737, 818

[56] References Cited

U.S. PATENT DOCUMENTS

| | | |
|---|---|---|
| 3,372,310 | 3/1968 | Kantor . |
| 4,700,840 | 10/1987 | Haddock . |
| 4,727,246 | 2/1988 | Hara et al. . |
| 4,758,689 | 7/1988 | Nakao et al. . |
| 4,868,713 | 9/1989 | Banjo et al. . |
| 4,872,091 | 10/1989 | Maniwa et al. . |
| 4,890,197 | 12/1989 | Banjo et al. . |
| 4,893,001 | 1/1990 | Ohkubo et al. . |
| 4,918,299 | 4/1990 | Ohmori . |
| 4,924,076 | 5/1990 | Kitamura . |
| 5,005,106 | 4/1991 | Kiku . |
| 5,014,160 | 5/1991 | McCoy, Jr. . |
| 5,017,767 | 5/1991 | Mizuno . |
| 5,038,250 | 8/1991 | Uenaka et al. . |
| 5,061,845 | 10/1991 | Pinnavaia . |
| 5,157,244 | 10/1992 | Mroczkowski et al. . |
| 5,173,840 | 12/1992 | Kodai et al. . |
| 5,187,642 | 2/1993 | Garner et al. . |
| 5,189,638 | 2/1993 | Kimura . |
| 5,207,586 | 5/1993 | MacGregor et al. . |
| 5,210,442 | 5/1993 | Ishimoto . |
| 5,242,310 | 9/1993 | Leung . |
| 5,278,445 | 1/1994 | Uemura et al. . |
| 5,313,364 | 5/1994 | Omori et al. . |
| 5,330,360 | 7/1994 | Marsh et al. . |
| 5,333,100 | 7/1994 | Anhalt et al. . |
| 5,339,222 | 8/1994 | Simmons et al. . |
| 5,386,340 | 1/1995 | Kurz . |
| 5,397,857 | 3/1995 | Farquhar et al. . |
| 5,413,490 | 5/1995 | Tan et al. . |
| 5,469,332 | 11/1995 | Alvite . |
| 5,470,237 | 11/1995 | Byczek et al. . |
| 5,476,387 | 12/1995 | Ramey et al. . |
| 5,477,426 | 12/1995 | Bethurum . |
| 5,519,577 | 5/1996 | Dudas et al. . |
| 5,546,278 | 8/1996 | Bethurum . |
| 5,557,507 | 9/1996 | Koike et al. . |
| 5,563,770 | 10/1996 | Bethurum . |
| 5,563,771 | 10/1996 | Bethurum . |
| 5,572,408 | 11/1996 | Anhalt et al. . |

FOREIGN PATENT DOCUMENTS

| | | |
|---|---|---|
| 0 055 017 | 6/1982 | European Pat. Off. . |
| 0 452 553 | 11/1991 | European Pat. Off. . |
| WO 95/24020 | 9/1995 | WIPO . |

*Primary Examiner*—Neil Abrams
*Attorney, Agent, or Firm*—Barnes & Thornburg

[57] ABSTRACT

A PC card assembly method and apparatus includes a printed circuit board having the front end edge, a rear end edge, and a first and second side edges. The printed circuit board includes a plurality of conductive pads. The apparatus also includes a front end connector located adjacent the front end edge of the printed circuit board. The front end connector has an insulative body and a plurality of conductive contacts which are coupled to the conductive pads on the printed circuit board. The apparatus further includes a back end plug located adjacent the rear end edge of the printed circuit board, and at least one metal rail having a first end coupled to the front end connector, a second end coupled to the back end plug, and an integral foot section coupled to a ground conductive pad on the printed circuit board to couple the rail to the printed circuit board electrically. The apparatus also includes conductive covers surrounding the printed circuit board, the front end connector, the back end plug and the at least one metal rail, the at least one rail having a resilient tab for being electrically coupled to the conductive covers to provide an electrostatic discharge path between the conductive covers and the printed circuit board.

17 Claims, 2 Drawing Sheets

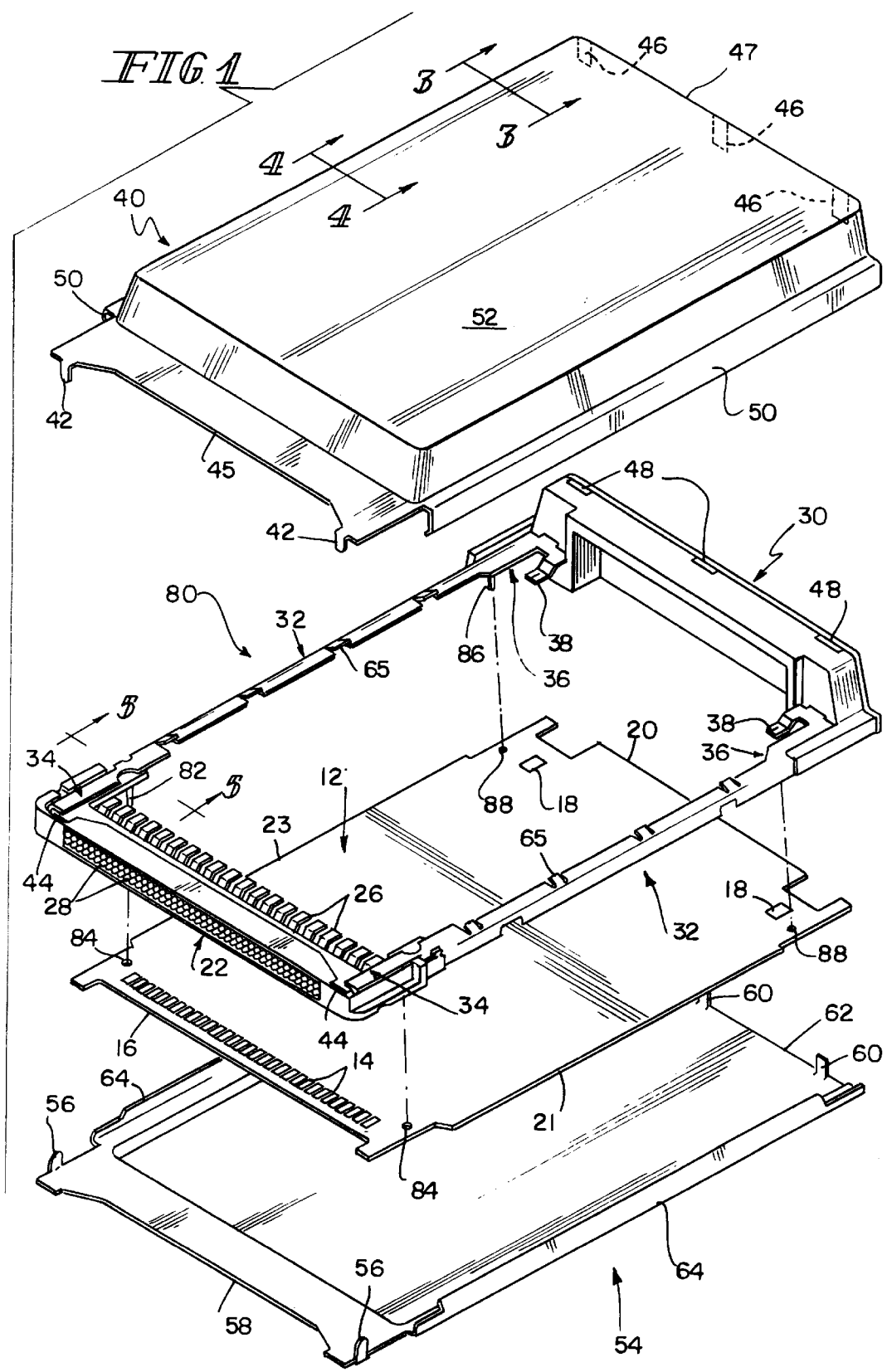

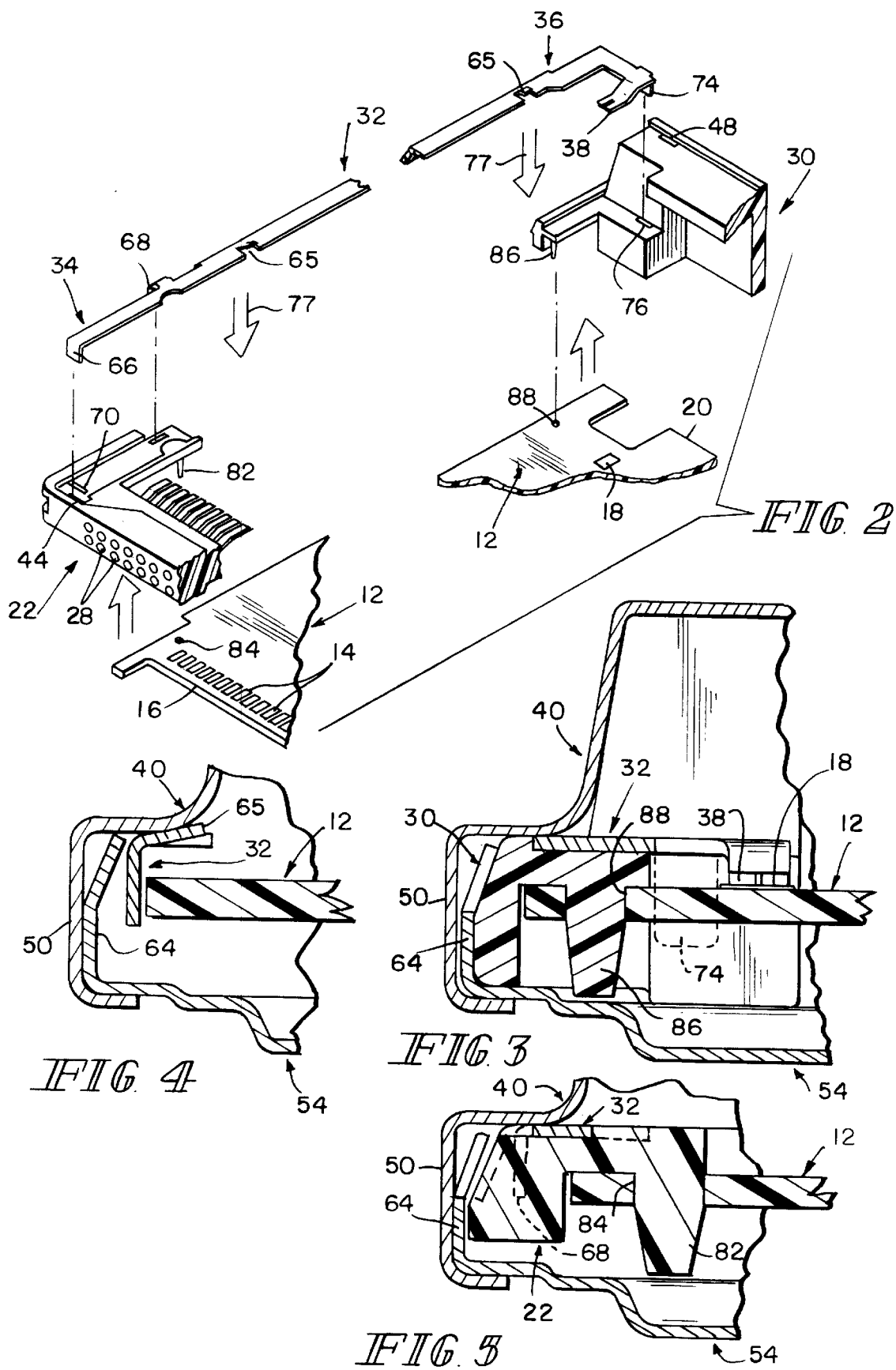

MEMORY CARD CONNECTOR AND COVER APPARATUS AND METHOD

This application is a continuation of U.S. application Ser. No. 08/638,612, filed Apr. 26, 1996, now abandoned.

BACKGROUND AND SUMMARY OF THE INVENTION

The present invention relates to a memory card connector and cover apparatus and method. More particularly, the present invention relates to an improved electrical connector and cover apparatus for a PC card, such as a memory card, which includes an improved electrostatic discharge (ESD) mechanism which also facilitates assembly of the PC card connector and cover.

Conventional memory card holders include a plastic frame for supporting a printed circuit board. Connectors are typically coupled to each end of the frame for providing an electrical connection to the printed circuit board. Metal covers are then placed over the frame to shield and protect the printed circuit board. See, for example, U.S. Pat. No. 5,330,360; U.S. Pat. No. 5,339,222; U.S. Pat. No. 5,386,340; and U.S. Pat. No. 5,476,387.

Another type of PC card does not require the separate plastic frame. In this frameless embodiment, connectors are separately placed on a printed circuit board, using a separate placement step for each connector. The connectors are then soldered to the printed circuit board. The connectors and the printed circuit board are then covered with top and bottom metallic covers.

The apparatus and method of the present invention also does not require use of the separate plastic frame for holding the circuit board. The present invention includes a front end socket having a plastic body portion which houses metallic contacts for engaging conductive pads on the printed circuit board. The apparatus also includes a back end plug which is a plastic shell used to close a rear end of the PC card. If desired, metal contacts can also be inserted into the back end plug to permit electrical signal transfer through the back end plug.

The apparatus of the present invention further includes ESD rails which extend between the front end socket connector and the back end plug. These rails are metal strips that are configured to provide a static electricity drain between the printed circuit board and external metal covers which are coupled to the electrical ground of the system. The ESD rails also couple the front end socket connector to the back end plug to provide a separate subassembly which can be placed as a single unit on the printed circuit board.

The apparatus of the present invention therefore facilitates placement of the connectors on the printed circuit board during assembly of the PC card. The rails provide stability to the connectors during processing and eliminate the requirement of a separate placement operation for both connectors.

Without the rails, the front end connector and the back end plug must be separately placed onto the circuit board during assembly of the PC card. These connectors rest on edges of the printed circuit board which creates a natural tendency for the connectors to move or fall off the printed circuit board if fixturing or adequate board retention is not present. The rails of the present invention change the center of gravity of the connectors once the subassembly is formed to reduce the likelihood that the connectors will fall off the printed circuit board. The rails strengthen and stabilize the PC card.

After the subassembly including the front end connector, the back end plug, and the ESD rails is assembled, placed on the circuit board, and soldered, metal covers are then placed over the subassembly and the circuit board without the requirement of a separate plastic support frame for the printed circuit board.

The improved apparatus and method of the present invention only requires one placement operation to place two connectors on the printed circuit board, without the use of fixturing or retentive devices. A static electricity drain is normally required between the printed circuit board and the ground chassis of the master unit. The present apparatus uses the required static electricity drain as a tie rail between the front end connector and back end plug. This allows for single connector placement at a very little cost increase for the product.

According to one aspect of the present invention, a PC card apparatus includes a printed circuit board having the front end edge, a rear end edge, and first and second side edges. The printed circuit board includes a plurality of conductive pads. The apparatus also includes a front end connector located adjacent the front end edge of the printed circuit board. The front end connector has an insulative body and a plurality of conductive contacts which are coupled to the conductive pads on the printed circuit board. The apparatus further includes a back end plug located adjacent the rear end edge of the printed circuit board, and at least one metal rail having a first end coupled to the front end connector, a second end coupled to the back end plug, and an integral foot section coupled to a ground conductive pad on the printed circuit board to couple the rail to the printed circuit board electrically. The apparatus also includes a conductive cover surrounding the printed circuit board, the front end connector, the back end plug, and the at least one metal rail. The at least one rail is electrically coupled to the conductive cover to provide an electrostatic discharge path between the conductive cover and the printed circuit board.

In the illustrated embodiment, the conductive cover includes a bottom conductive cover coupled to the front end connector and back end plug. The bottom cover is formed to include side edges extending upwardly along the side edges of the printed circuit board. The conductive cover also includes a top conductive cover coupled to the front end connector and back end plug. The top cover is formed to include first and a second channels configured to surround the side edges of the bottom cover to secure the top and bottom covers together. The at least one rail is electrically coupled to the top and bottom conductive covers to provide the electrostatic discharge path.

Also in the illustrated embodiment, the top cover is formed to include at least one front tab configured to enter a slot formed in a top surface of the front end connector and at least one rear tab configured to enter a slot formed in a top surface of the back end plug to couple the top cover to the front end connector and back end plug, respectively. The bottom cover is formed to include at least one front tab configured to enter a slot formed in a bottom surface of the front end connector and at least one rear tab configured to enter a slot formed in a bottom surface of the back end plug to couple the bottom cover to the front end connector and back end plug, respectively.

The illustrated embodiment also includes first and second spaced apart metal rails which are coupled to the front end connector and to the back end plug. The first and second rails are located adjacent the first and second side edges of the printed circuit board, respectively. Each metal rail is formed to include at least one front tab configured to enter a slot formed in the front end connector and at least one rear tab configured to enter a slot formed in the back end plug to couple the rail to the front end connector and back end plug, respectively.

The printed circuit board is formed to include first alignment apertures located near the front end edge and second alignment apertures located near the rear end edge. The front end connector is formed to include alignment pins configured to enter the first alignment apertures, and the back end plug is formed to include alignment pins configured to enter the second alignment apertures to align the front end connector and back end plug, respectively, relative to the printed circuit board. Each rail includes an upwardly extending tab portion configured to engage the conductive cover, and is preferably stamp formed from a sheet metal material.

According to another aspect of the present invention, a method is provided for assembling a PC card apparatus which includes a printed circuit board having a front end edge, a rear end edge, and first and second side edges, the printed circuit board being formed to include a plurality of conductive pads, a front end connector having an insulative body and a plurality of conductive contacts, a back end plug, and a conductive cover. The method includes the steps of providing at least one metal rail, coupling the at least one metal rail to the front end connector and to the back end plug to form a subassembly, and placing the subassembly on the printed circuit board as a single unit with the front end connector located adjacent the front end edge of the printed circuit board and with back end plug located adjacent the rear end edge of the printed circuit board. The method also includes the steps of soldering the contacts of the front end connector to the conductive pads of the printed circuit board, and installing the conductive cover over the printed circuit board, the front end connector, the back end plug, and the at least one metal rail.

In the illustrated method, the step of installing the conductive cover includes the step of coupling a bottom conductive cover to a bottom surface of the front end connector and to a bottom surface of the back end plug, and the step of coupling a top conductive cover to a top surface of the front end connector and to a top surface of the back end plug. The top cover is configured to engage the bottom cover.

The at least one metal rail is configured to engage the conductive cover and is formed to include an integral foot section configured to engage a ground conductive pad on the printed circuit board. The soldering step includes the step of soldering the integral foot section of the at least one metal rail to a ground conductive pad on the printed circuit board to provide an electrostatic discharge path between the conductive cover and the printed circuit board.

In the illustrated method, the coupling step includes the steps of coupling first and second spaced apart metal rails to the front end connector and to the back end plug. The first and second rails are located adjacent the first and second side edges of the printed circuit board, respectively, during the placing step.

Additional objects, features, and advantages of the invention will become apparent to those skilled in the art upon consideration of the following detailed description of the preferred embodiment exemplifying the best mode of carrying out the invention as presently perceived.

BRIEF DESCRIPTION OF THE DRAWINGS

The detailed description particularly refers to the accompanying figures in which:

FIG. 1 is an exploded perspective view of the PC card connector and cover apparatus of the present invention;

FIG. 2 is an exploded perspective view with portions broken away to illustrate details of the ESD rails connected to a front end socket connector and to a back end plug to provide a connector subassembly;

FIG. 3 is a sectional view taken along lines 3—3 of FIG. 1, after the connector subassembly and top and bottom covers have been positioned around the printed circuit board, illustrating engagement of a foot portion of the rail with a conductive pad formed on the printed circuit board to provide a static electricity drain between the printed circuit board and the external covers;

FIG. 4 is a sectional view taken along lines 4—4 of FIG. 1 illustrating engagement of a tab on one of the rails with the top cover to provide an electrical connection between the rails and the top and bottom covers; and FIG. 5 is a sectional view taken along lines 5—5 of FIG. 1 further illustrating the configuration of the rails and the front end connector.

DETAILED DESCRIPTION OF DRAWINGS

Referring now to the drawings, FIG. 1 illustrates the PC card apparatus 10 of the present invention. PC cards typically contain external memory and data to be used in computer processes. The PC cards can be plugged into computers, fax machines, printers, and any other computer-related electronic equipment that requires an external printed circuit interface. Standards for PC cards are defined by the Personal Computer Memory Card International Association (PCMCIA). The PC card 10 of the present invention may be a memory card, a smart card, a chip card, or other type card.

The PC card 10 of the present invention includes printed circuit board 12 having a plurality of conductive pads 14 formed near a front end edge 16. It is understood that these conductive pads 14 connected to conductive traces on the printed circuit board 12 which are, in turn, connected to electronic components (not shown) on the printed circuit board 12 in a conventional manner. Printed circuit board 12 is also formed to include a pair of conductive pads 18 located near a rear end edge 20 of the printed circuit board 12. These conductive pads 18 are used to provide a ground connection to the printed circuit board 12. Printed circuit board 12 also includes opposite side edges 21 and 23.

The PC card apparatus 10 further includes a front end socket connector 22 having a plastic body 24 for housing a plurality of contacts 26. The front end connector 22 includes a plurality of apertures 28 for receiving contact pins of a header connector (not shown) to couple the header connector to the PC card 10 through contacts 26.

The apparatus 10 also includes a back end plug 30 which is illustratively a plastic shell located near the rear edge 20 of printed circuit board 12. If desired, metallic contacts can also be provided on back end plug 30 to provide another electrical connection to the printed circuit board 12.

The apparatus 10 further includes a pair of electrostatic discharge (ESD) metal rails 32 which extend between the front end socket connector 22 and the back end plug 30. Rails 32 are preferably stamp formed from a sheet metal material. Front end portions 34 of the rails 32 are connected to the front end socket connector 22. Rear end portions 36 of the rails 32 are connected to the back end plug 30 as discussed in detail below with reference to FIG. 2.

Each rail 32 is formed to include a downwardly extending foot section 38. The foot sections 38 are configured to be electrically coupled to the conductive pads 18 on the printed circuit board 12 to provide a ground connection between the rails 32 and the printed circuit board 12 as illustrated in FIG. 3.

The PC card apparatus 10 also includes a top cover 40 which has barbed tabs 42 formed adjacent front edge 45. Tabs 42 are configured to engage slots 44 formed in a top surface of the front end socket connector 22. Top cover 40 also includes barbed tabs 46 formed adjacent a rear edge 47 of top cover 40. Tabs 46 are configured to engage slots 48 formed in a top surface of the back end plug 30. Top cover 40 also includes a pair of U-shaped channels 50 and a central portion 52 which extends upwardly relative to the channels 50 so that the overall thickness of the memory card 10 is substantially greater than the thickness of the channels 50. Preferably, card 10 is a Type II and Type III PC Card as defined by the PCMCIA. Top cover 40 is preferably stamp formed from a sheet metal material.

The PC card apparatus 10 also includes a bottom cover 54 which is also stamp formed from a sheet metal material. Bottom cover 54 is formed to include barbed tabs 56 adjacent a front edge 58. Tabs 56 are configured to engage slots formed in a bottom surface of front end socket connector 22. Cover 54 is also formed to include barbed tabs 60 adjacent a rear edge 62. The tabs 60 are configured to engage slots formed in the bottom surface of back end plug 30. Bottom cover 54 further includes side edges 64 which are bent upwardly. During assembly of the memory card 10, the side edges 64 of bottom cover 54 are received within the channels 50 of the top cover 40 to lock the top and bottom covers 40 and 54 over the printed circuit board 12 as illustrated in FIGS. 3–5. Therefore, the top and bottom metallic covers 40 and 54 are electrically coupled together. In addition, the rails 32 engage at least the top cover 40 to provide an electrical connection between the top and bottom covers 40 and 54, the rails 32, and the printed circuit board 12 through conductive pads 18 coupled to the foot sections 38 of the rails 32. Rails 32 include upwardly extending tabs 65 for engaging the top cover 40 as best illustrated in FIG. 4.

FIG. 2 illustrates details of the connection between the rails 32 and the front end socket connector 22 and back end plug 30. Each rail 32 is formed to include first and second downwardly projecting barbed tabs 66 and 68 adjacent the front end 34. The tabs 66 and 68 are configured and positioned to enter slots 70 and 72 formed in front end socket connector 22 to couple the rail 32 to the connector 22. The rear end 36 of each rail 32 is formed to include a downwardly extending barbed tab 74. Tab 74 is configured to enter and engage a slot 76 formed in the back end plug 30 to couple the rail 32 to the back end plug 30. The rails 32 are installed by moving the rails 32 downwardly toward the front end connector 22 and back end plug 30 in the direction of arrows 77.

During the assembly method for the memory card apparatus 10, the rails 32 are first coupled between the front end connector 22 and the back end plug 30 to provide a subassembly 80 as illustrated in FIG. 1. This subassembly 80 allows both the front end connector 22 and the back end plug 30 to be placed on the printed circuit board 12 as a single unit with a single placement operation. Fixturing or retentive devices are not required during the soldering process. The subassembly 80 is then placed on the printed circuit board 12. Alignment pins 82 formed on front end connector 22 extend through alignment apertures 84 formed adjacent the front end edge 16 of printed circuit board 12 as best shown in FIGS. 2 and 5. Alignment pins 86 formed on back end plug 30 extend through alignment apertures 88 formed adjacent the rear end edge 20 of printed circuit board 12 as best shown in FIGS. 2 and 3. The center of gravity of the subassembly 80 is near the center of the printed circuit board 12.

Next, the contacts 26 are soldered to conductive pads 14 and contact foot sections 38 of the rails 32 are soldered to conductive pads 18 using a conventional soldering process. Once foot sections 38 are soldered to conductive pads 18, the rails 32 hold the front end connector 22 and back end plug 30 on the printed circuit board. The rails 32 provide rigidity and stability to the apparatus 10 without the use of a separate plastic frame for supporting the printed circuit board 12.

Next, the covers 40 and 54 are installed. Bottom cover 54 is installed so that tabs 56 adjacent front end 58 and tabs 60 adjacent rear end 62 enter the apertures formed in the bottom surfaces of front end connector 22 and back end plug 30, respectively. Tabs 56 and 60 provide an interference fit with the connector 22 and back end plug 30 to couple the bottom cover 54 to the subassembly 80.

After the bottom cover 54 is secured to the subassembly 80, the top cover is inserted straight downwardly so that the tabs 42 adjacent to front edge 45 enter the slots 44 formed in connector 22. Tabs 46 enter the slots 48 formed in the back end plug 30. Therefore, tabs 42 and 46 secure the top cover 40 to the subassembly 80. In addition, the channels 50 surround side edges 64 of bottom cover 54 to lock the top and bottom covers 40 and 54 together.

Accordingly, the apparatus of the present invention facilitates assembly of the PC card 10. In addition, the metal rails 32 provide the required ESD connection between the conductive covers 40 and 54 and the printed circuit board 12.

Accordingly, the invention has been described in detail with reference to a certain preferred embodiment, variations and modifications exist within the scope and spirit of the present invention as described and defined in the following claims.

What is claimed is:

1. A PC card apparatus comprising:
   a printed circuit board having a front end edge, a rear end edge, and first and second side edges, the printed circuit board including a plurality of conductive pads;
   a front end connector located adjacent the front end edge of the printed circuit board, the front end connector having an insulative body and a plurality of conductive contacts which are electronically coupled to the conductive pads on the printed circuit board;
   a back end plug located adjacent the rear end edge of the printed circuit board;
   at least one metal rail having a first end coupled to the front end connector, a second end coupled to the back end plug, and an integral foot section electrically coupled to a ground conductive pad on the printed circuit board and wherein the said two electrical couplings also provide a physical connection to provide the sole support for the circuit board against the front end connector, the back end plug and the at least one metal rail; and
   a conductive cover surrounding the printed circuit board, the front end connector, the back end plug, and the at least one metal rail, the at least one rail being electrically coupled to the conductive cover to provide an electrostatic discharge path between the conductive cover and the printed circuit board.

2. The apparatus of claim 1, wherein the conductive cover includes a bottom conductive cover coupled to the front end connector and back end plug, the bottom cover being formed to include side edges extending upwardly along the side edges of the printed circuit board, and a top conductive cover coupled to the front end connector and back end plug, the top cover being formed to include first and a second channels configured to surround the side edges of the bottom cover to secure the top and bottom covers together, the at least one rail being electrically coupled to the top and bottom conductive covers to provide the electrostatic discharge path.

3. The apparatus of claim 2, wherein the top cover is formed to include at least one front tab configured to enter a slot formed in a top surface of the front end connector and at least one rear tab configured to enter a slot formed in a top surface of the back end plug to couple the top cover to the front end connector and back end plug, respectively.

4. The apparatus of claim 2, wherein the bottom cover is formed to include at least one front tab configured to enter a slot formed in a bottom surface of the front end connector and at least one rear tab configured to enter a slot formed in a bottom surface of the back end plug to couple the bottom cover to the front end connector and back end plug, respectively.

5. The apparatus of claim 1, wherein the apparatus includes first and second spaced apart metal rails which are coupled to the front end connector and to the back end plug, the first and second rails being located adjacent the first and second side edges of the printed circuit board, respectively.

6. The apparatus of claim 1, wherein the at least one metal rail is formed to include at least one front tab configured to enter a slot formed in the front end connector and at least one rear tab configured to enter a slot formed in the back end plug to couple the rail to the front end connector and back end plug, respectively.

7. The apparatus of claim 1, wherein the printed circuit board is formed to include first alignment apertures located near the front end edge and second alignment apertures located near the rear end edge, the front end connector being formed to include alignment pins configured to enter the first alignment apertures, and the back end plug being formed to include alignment pins configured to enter the second alignment apertures to align the front end connector and back end plug, respectively, relative to the printed circuit board.

8. The apparatus of claim 1, wherein the at least one metal rail includes an upwardly extending tab portion configured to engage the conductive cover.

9. The apparatus of claim 1, wherein the at least one metal rail is stamp formed from a sheet metal material.

10. A method of assembling a PC card apparatus which includes a printed circuit board having a front end edge, a rear end edge, and first and second side edges, the printed circuit board being formed to include a plurality of conductive pads, a front end connector having an insulative body and a plurality of conductive contacts, a back end plug, and a conductive cover, the method comprising the steps of:

providing at least one metal rail;

coupling the at least one metal rail to the front end connector and to the back end plug to form a subassembly;

placing the subassembly on the printed circuit board as a single unit with the front end connector located adjacent the front end edge of the printed circuit board and with back end plug located adjacent the rear end edge of the printed circuit board;

soldering the contacts of the front end connector to the conductive pads of the printed circuit board and coupling the at least one side metal rail to the circuit board to provide the sole support for the circuit board by the subassembly; and installing the conductive cover over the printed circuit board, the front end connector, the back end plug, and the at least one metal rail.

11. The method of claim 10, wherein the step of installing the conductive cover includes the steps of coupling a bottom conductive cover to a bottom surface of the front end connector and to a bottom surface of the back end plug, and the step of coupling a top conductive cover to a top surface of the front end connector and to a top surface of the back end plug, the top cover being configured to engage the bottom cover.

12. The method of claim 10, wherein the at least one metal rail is configured to engage the conductive cover and is formed to include an integral foot section configured to engage a ground conductive pad on the printed circuit board, and wherein the soldering step includes the step of soldering the integral foot section of the at least one metal rail to a ground conductive pad on the printed circuit board to provide an electrostatic discharge path between the conductive cover and the printed circuit board.

13. The method of claim 10, wherein the coupling step includes the steps of coupling first and second spaced apart metal rails to the front end connector and to the back end plug, the first and second rails being located adjacent the first and second side edges of the printed circuit board, respectively, during the placing step.

14. The method of claim 10, wherein the at least one metal rail includes an upwardly extending tab portion configured to engage the conductive cover.

15. The method of claim 10, wherein the at least one metal rail is stamp formed from a sheet metal material.

16. A PC card apparatus comprising:

a printed circuit board having the front end edge, a rear end edge, and first and second side edges, the printed circuit board including a plurality of conductive pads formed adjacent the front end edge;

a front end connector located adjacent the front end edge of the printed circuit board, the front end connector having an insulative body and a plurality of conductive contacts which are physically and electrically coupled to the conductive pads on the printed circuit board;

a back end plug located adjacent the rear end edge of the printed circuit board;

first and second metal rails located adjacent the first and second side edges of the printed circuit board, respectively, the first and second rails each having a first end coupled to the front end connector, a second end coupled to the back end plug, and an integral foot section physically and electrically coupled to a ground conductive pad on the printed circuit board to couple the first and second rails to the printed circuit board electrically and wherein the said two physical and electrical connections also provide the sole support for the circuit board against the front end connector, the back end plug and the at least one metal rail; and a conductive cover surrounding the printed circuit board, the front end connector, the back end plug, and the first and second rails, the first and second rails being electrically coupled to the conductive cover to provide an electrostatic discharge path between the conductive cover and the printed circuit board.

17. A method of assembling a PC card apparatus which includes a printed circuit board having a front end edge, a rear end edge, and first and second side edges, the printed circuit board being formed to include a plurality of conductive pads, a front end connector having an insulative body and a plurality of conductive contacts, a back end plug, and a conductive cover, the method comprising the steps of:

providing a first and second metal rails, each rail having a first end, a second end, and an integral foot section;

coupling the first ends of the first and second metal rails to the front end connector, and the second ends of the first and second metal rails to the back end plug to form a subassembly;

placing the subassembly on the printed circuit board as a single unit with the front end connector located adjacent the front end edge of the printed circuit board, with the back end plug located adjacent the rear end edge of the printed circuit board, and with the first and second rails located adjacent the first and second side edges of the printed circuit board;

soldering the contacts of the front end connector to the conductive pads of the printed circuit board and the integral foot sections of the first and second rails to ground conductive pads on the printed circuit board to couple the first and second rails to the printed circuit board electrically and to provide the sole support for the circuit board by the subassembly; and installing the conductive cover over the printed circuit board, the front end connector, the back end plug, and the first and second metal rails, the first and second rails being electrically coupled to the conductive cover to provide an electrostatic discharge path between the conductive cover and the printed circuit board.

* * * * *